United States Patent [19]
Yagishita et al.

[11] Patent Number: 6,104,659
[45] Date of Patent: Aug. 15, 2000

[54] MEMORY DEVICE

[75] Inventors: Yoshimasa Yagishita; Toshiya Uchida; Masaki Okuda, all of Kawasaki, Japan

[73] Assignee: Fujitsu Limited, Kawasaki, Japan

[21] Appl. No.: 09/338,599

[22] Filed: Jun. 23, 1999

[30] Foreign Application Priority Data

Jul. 16, 1998 [JP] Japan .................................. 10-201458

[51] Int. Cl.$^7$ ...................................................... G11C 7/00
[52] U.S. Cl. ............... 365/226; 365/189.09; 365/189.11; 365/233.5
[58] Field of Search .................... 365/189.07, 189.09, 365/189.11, 230.03, 226, 233.5

[56] References Cited

U.S. PATENT DOCUMENTS

| | | | |
|---|---|---|---|
| 5,612,924 | 3/1997 | Miyamoto | 365/233.5 |
| 5,814,851 | 9/1998 | Suh | 257/296 |
| 6,038,178 | 3/2000 | Oh | 365/189.09 |
| 6,041,012 | 3/2000 | Banba et al. | 365/226 |

FOREIGN PATENT DOCUMENTS

8-237938  9/1996  Japan .

*Primary Examiner*—David Nelms
*Assistant Examiner*—Gene N. Auduong
*Attorney, Agent, or Firm*—Arent Fox Kintner Plotkin & Kahn, PLLC

[57] ABSTRACT

A memory device comprises: a plurality of banks each of which includes an array of memory cells; and at least a first and a second internal power generator, provided for each of the plurality of banks, for generating an internal power source voltage which differs from a voltage supplied by an external power source. If the internal common power source voltage in the memory device is lower than the first voltage when the power is on, the first and the second internal power generators in a plurality of banks are activated so as to rapidly raise the common internal power source voltage. When the common internal power source voltage in the memory device is higher than the first voltage and lower than the second voltage, the second internal power generators in the banks are activated to compensate for a drop in the internal power source voltage, which is caused by current leakage. When the internal power source voltage in a bank in the activated state is lower than the third voltage, the first and the second internal power generators in the corresponding bank are activated and satisfactorily drive the internal power source voltage in the bank so as to operate the memory device at a high speed.

9 Claims, 8 Drawing Sheets

Memory Device of the Embodiment

FIG. 1
Memory Device of the Embodiment

FIG. 2
Memory Device of the Embodiment

FIG. 3

Operation of Common Internal Power Source Detector 52

| Internal Power Source Voltage Vpp | Common Internal Power Source Detector 52 | | Pump Circuit PUMP at activated or deactivated state |
|---|---|---|---|
| | VPM | VPL | |
| Mv < Vpp | L | L | No pump operates |
| Lv < Vpp ≤ Mv | H | L | 4 pumps operate (12,22,32,42) |
| Vpp ≤ Lv | H | H | 8 pumps operate (12,15,22,25,32,35,42,45) |

FIG. 4

Operation of Bank Internal Power Source Detector 13, 23, 33, 43

| Internal Power Source Voltage Vpp | VPH for Bank Internal Power Source Voltage Detector in activated bank | Pump Circuit PUMP |
|---|---|---|
| Hv < Vpp | L | No pump operates |
| Vpp ≤ Hv | H | 2 pumps(12,15) in activated bank operate |

FIG. 5

Common Internal Power Source Voltage Detector

FIG. 6

Bank Internal Power Source Voltage Detector

FIG. 7

Oscillator

FIG. 8

Counter 11, 14, 21, 24, 31, 34, 41, 44

FIG. 9
Pump Circuit 12, 15, 22, 25, 32, 35, 42, 45

MEMORY DEVICE

BACKGROUND OF THE INVENTION

1. Field of the Invention

The present invention relates to a memory device, and in particular to a memory device which has an internal power generator for stably supplying power to an internal circuit.

2. Related Arts

Recent semiconductor memory devices, particularly dynamic random access memories (DRAMs), employ voltages, higher than the power source voltage which is externally supplied, either for a gate voltage of a cell transistor or for a back bias voltage so that a write operation and read operation become faster. Thus, a pump circuit is provided inside a DRAM to generate an internal power source voltage which is higher than the externally supplied power source voltage.

Specifically, two types of pump circuit are provided: a main pump circuit and a sub-pump circuit. The main pump circuit is operated when power is on and when a cell transistor is switched, while the sub-pump circuit is operated to compensate for the electric charge leakage which occurs when the cell transistor is not driven. That is, at deactivation time when no writing or reading is performed and only current leakage need be compensated for, only the sub-pump circuit, which has a low charge supply capability and consumes only a small amount of power, is operated in order to reduce the power consumed by the DRAM.

As the memory capacity is increased, in the DRAM a plurality of banks are employed. For the bank arrangement, a memory cell array is divided into a plurality of banks, with each bank then being divided into a plurality of blocks. The individual banks are activated independently, and when a bank is no longer required to operate, it is deactivated in order to reduce the consumption of power. In addition, in order to supply the current to the memory cell arrays of the individual blocks with a low impedance, a main pump circuit and a sub-pump circuit are provided for each block.

At present, there is a drastically increased demand for memory devices, particularly for DRAM, with which high writing and reading speeds and high integration are possible. However, when the speed of DRAM is increased, the power consumed by one of the cell transistors increases, so that a pump circuit having a high charge supply capability is required. As a result, the size of the area required for the pump circuit is increased, and the power consumed by the pump circuit is also increased.

In a case where a main pump circuit and a sub-pump circuit are provided for each block, but only the sub-pump circuit is operated for the block at the deactivation time, the power consumption is reduced. However, the ratio of the total area for the main pump circuits and the sub-pump circuits to the area of the memory cell array is increased, and the demand of high integration of the DRAM is not met.

SUMMARY OF THE INVENTION

It is, therefore, one objective of the present invention to provide a memory device for which the ratio of the area required for a pump circuit to the area required for a memory cell array is small and high integration is possible.

It is another objective of the present invention to provide a memory device for which a current, required for the writing or reading operations to a memory cell, can be efficiently supplied to an internal power source necessary for operation, and with which a low consumption of power and high integration can be attained.

To achieve the above objectives, according to the present invention, a memory device comprises:

a plurality of banks each of which includes an array of memory cells; and at least a first and a second internal power generator, provided for each of the plurality of banks, for generating an internal power source voltage which differs from a voltage supplied by an external power source, wherein, when a common internal power source voltage in the memory device is lower than a first voltage, the first and second internal power generators in the plurality of banks are activated, wherein, when the common internal power source voltage in the memory device is higher than the first voltage and lower than a second voltage, which is higher than the first voltage, the second internal power generators in the plurality of banks are activated, and wherein, when said internal power source voltage in a bank in the activated state is lower than a third voltage, the first and second internal power generators in the corresponding bank are activated.

According to the present invention, if the internal common power source voltage in the memory device is lower than the first voltage when the power is on, the first and the second internal power generators in a plurality of banks are activated so as to rapidly raise the common internal power source voltage. When the common internal power source voltage in the memory device is higher than the first voltage and lower than the second voltage, the second internal power generators in the banks are activated to compensate for a drop in the internal power source voltage, which is caused by current leakage. When the internal power source voltage in a bank in the activated state is lower than the third voltage, the first and the second internal power generators in the corresponding bank are activated and satisfactorily drive the internal power source voltage in the bank so as to operate the memory device at a high speed. Since a plurality of internal power generators are provided for each bank, and the number of the internal power generators to be operated is changed in accordance with the level of the common internal power source voltage and the level of the bank internal power source voltage in the activated bank, the memory device can be efficiently operated and high integration can be implemented.

Also, to achieve the above objectives, according to a preferred embodiment, a memory device further comprises:

a common internal power source voltage detector for generating a first activation signal when the common internal power source voltage in the memory device is lower than the first voltage, and for generating a second activation signal when the common internal power source voltage is higher than the first voltage and lower than the second voltage, wherein the first and the second internal power generators in the plurality of banks are activated in response to the first activation signal, and the second internal power generators in the plurality of banks are activated in response to the second activation signal.

According to the present invention, since the common internal power source voltage detector is provided to activate the first and the second internal power generators in the banks when the common internal power source voltage in the memory device is lower than the first voltage, and to activate the second internal power generators in the banks when the common internal power source voltage in the memory device is higher than the first voltage and lower than the second voltage, the number of internal power generators to be operated can be changed in accordance with the common internal power source voltage in the memory device, and drop of the internal power source voltage due to current leakage can be efficiently compensated for. The common internal power source voltage detector operates regardless at activation state or at inactivation state of the memory device. Further, the first and second internal power generators have a substantially same power generation capability or current drive capability.

DETAILED DESCRIPTION OF THE PREFERRED EMBODIMENT

The preferred embodiment of the present invention will now be described while referring to the accompanying drawings. It should be noted, however, that the technical scope of the present invention is not limited to this embodiment.

Figure 1:
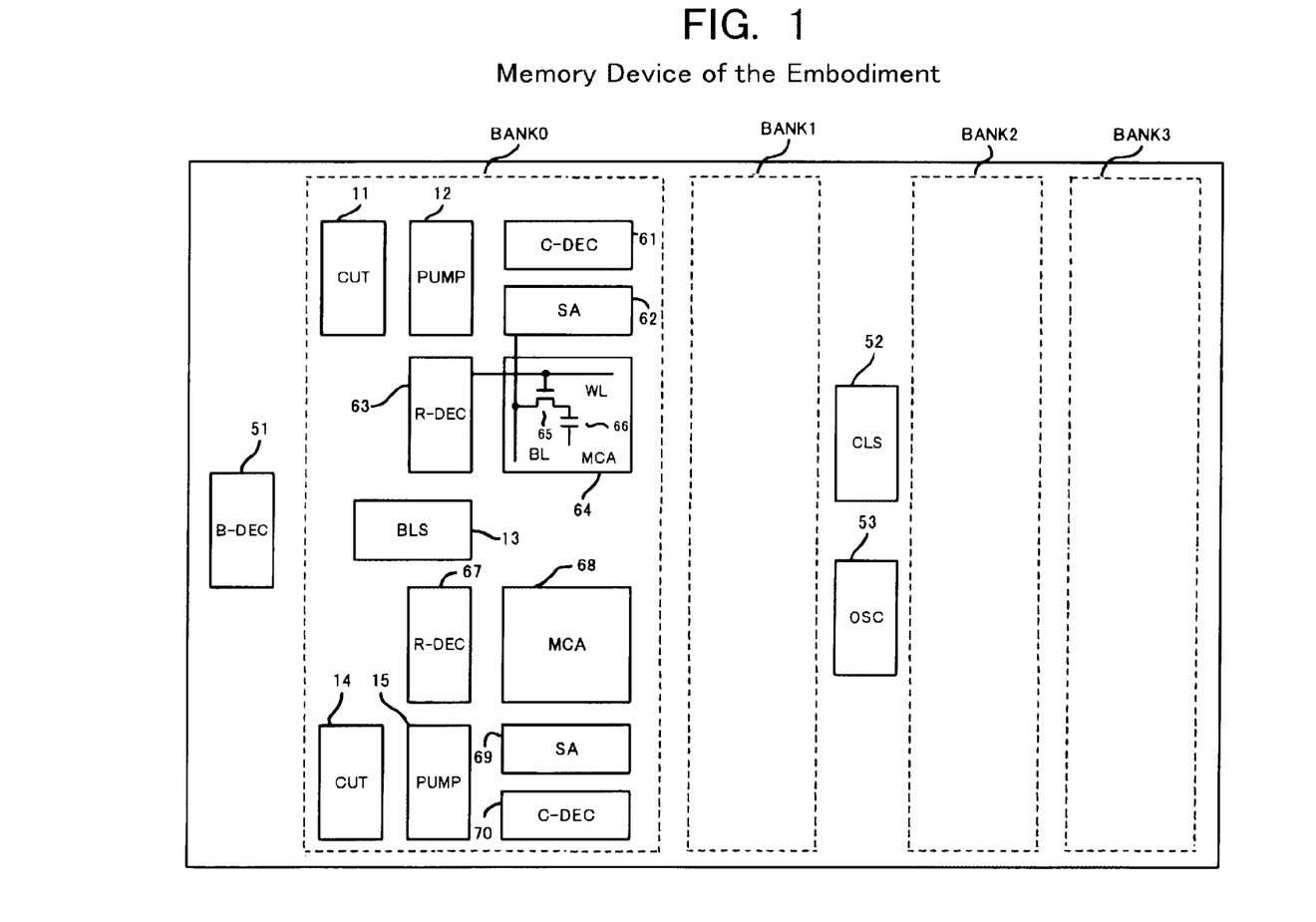
FIG. 1 is a block diagram illustrating a memory device according to one embodiment of the present invention.

FIG. 1 is a block diagram illustrating a memory device according to one embodiment of the present invention. In this embodiment, the memory device, or a DRAM, for example, has four banks, BANK0 to 3; these banks can be operated independently.

As shown in FIG. 1, bank BANK0, representative of all the banks in FIG. 1, includes memory cell arrays 64 and 68, sense amplifiers 62 and 69, row decoders 63 and 67, column decoders 61 and 70, counter circuits 11 and 14, and pump circuits 12 and 15. Since a block is constituted by one of each of these components, each of the individual banks in FIG. 1, BANK0 to 3, has two blocks respectively.

In the memory cell array 64, memory cells each including a cell transistor 65 and a capacitor 66, which are connected to a word line WL and a bit line BL, are arranged as a matrix, and a writing or reading process is performed for a memory cell which is specified by the row decoder 63 and the column decoder 61. The other banks, BANK1 to 3, have the same arrangement as has the bank BANK0.

The individual banks, BANK0 to 3, each include a bank internal power source voltage detector 13 for monitoring an internal power source voltage supplied to the corresponding bank. In this embodiment, the DRAM further includes a bank decoder 51, for decoding a row address signal to detect a bank to be accessed; a common internal power source voltage detector 52, located in the center of the DRAM, for monitoring the internal power source voltage; and an oscillator 53, for supplying a clock signal to the pump circuits 12 and 15, which are bank internal power generators.

Figure 2:
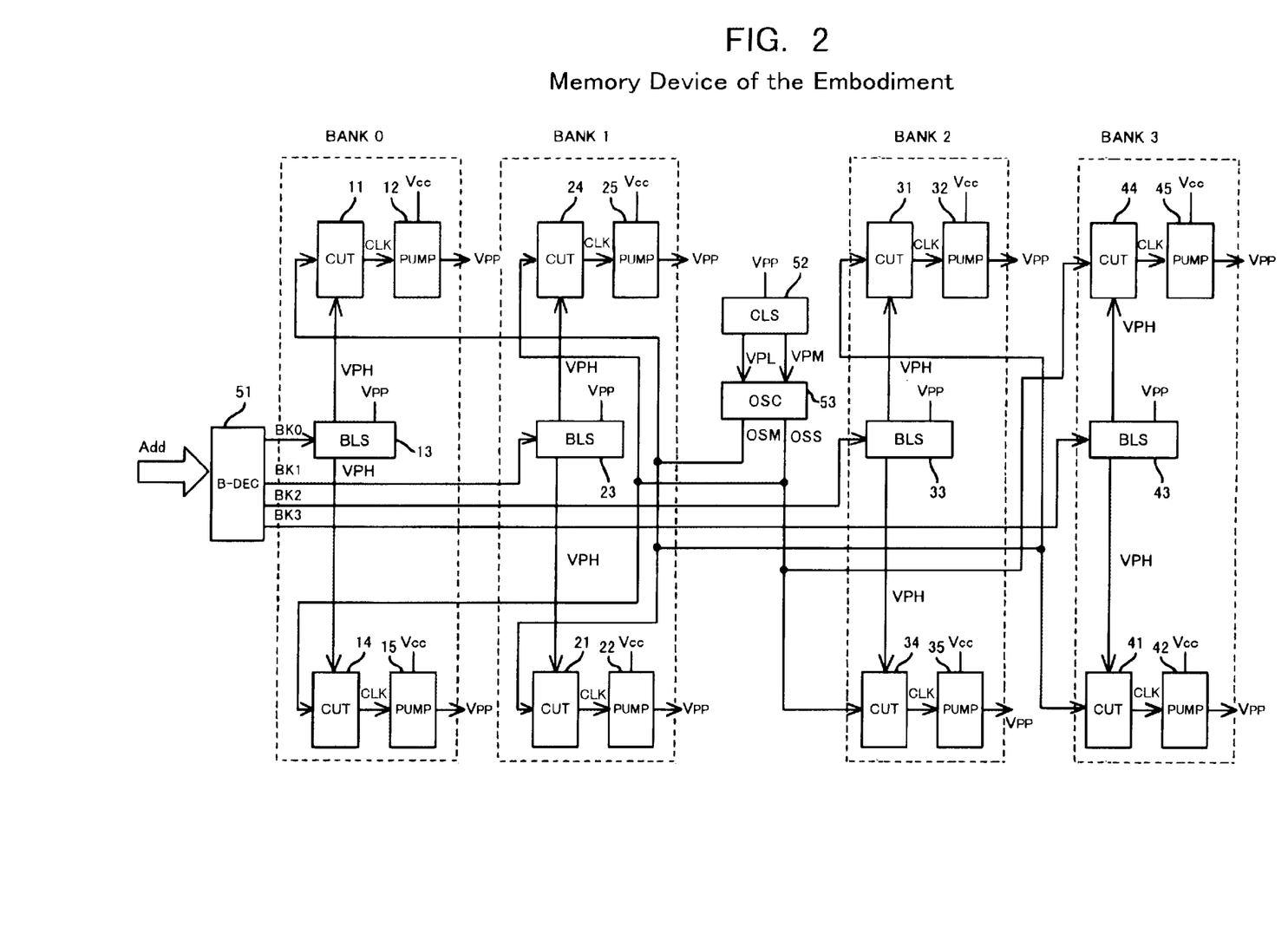
FIG. 2 is a circuit diagram illustrating the memory device according to the embodiment of the present invention.

FIG. 2 is a circuit diagram showing connections for the pump circuits 12, 22, 32, 42 and 15, 25, 35, 45 and the other components in the DRAM according to this embodiment. An external power source voltage Vcc is supplied to pump circuits 12, 15, 22, 25, 32, 35, 42 and 45 of the banks BANK0 to 3, and a boosted internal power voltage Vpp is generated by the pump circuit. The pump circuits 12 and 15, etc., and the other components, are provided for the banks BANK0 to 3, and the pump circuits 12 and 15, etc., are arranged near the memory cell arrays 64 and 68 as shown in FIG. 1. Thus, the pump circuits 12 and 15 can supply a current at a low impedance to the internal power source Vpp for the memory cell arrays 64 and 68.

Since the pump circuits 12 and 15, etc. are connected in common to an internal power source line, the pump circuits can supply the internal power source voltage Vpp to the banks including the pump circuits 12 and 15, and can compensate the internal power source voltages Vpp for the other banks, which are lowered by current leakage when the DRAM is deactivated. In this case, the changes in the internal power source voltages Vpp are monitored by a common internal power source voltage detector 52 and bank internal power source voltage detectors 13, 23, 33 and 43.

The common internal power source voltage detector 52 is a voltage comparator for comparing two threshold voltages LV and MV (LV<MV) with the internal power source voltage Vpp. The threshold voltage LV corresponds to a first voltage, and the threshold voltage MV corresponds to a second voltage in the present invention. This voltage comparator is located substantially in the center of the DRAM, and mainly monitors a fall of the overall internal power source voltage Vpp.

When the internal power source voltage Vpp falls lower than the threshold voltage MV, the common internal power voltage detector 52 sets a detection signal VPM to level H. And when the internal power source voltage Vpp further falls lower than the threshold voltage LV (<MV), the common internal power source voltage detector 52 sets a detection signal VPL to level H.

The oscillator 53 receives detection signals VPM and VPL from the common internal power source voltage detector 52, and in response to the level H of the detection signal VPM outputs an oscillation signal OSM to cause four pump circuits 12, 22, 32 and 42 to operate. Further, in response to the level H of the detection signal VPL, the oscillator 53 outputs an oscillation signal OSS to cause four pump circuits 15, 25, 35 and 45 to operate as well as the pump circuits 12, 22, 32 and 42. In this case, the pump circuits (internal power generators) 12, 22, 32 and 42 are alternately located in the upper and lower portions of the individual banks BANK0 to 3, and efficiently compensate for the drop of the internal power source voltage Vpp, which is caused by current leakage.

That is, when the power is on, since the internal power source voltage Vp is equal to or lower than the threshold voltage LV (first voltage), the common internal power source voltage detector 52 drives all eight of the pump circuits to quickly raise the internal power source voltage Vpp.

When the internal power source voltage vpp is raised higher than the threshold voltage LV (first voltage), the internal power source voltage detector drives only a part of the pump circuits, e.g., the four pump circuits 12, 22, 32 and 42, one for each bank. When the internal power source voltage Vpp is further raised higher than the threshold voltage MV (second voltage), the internal power source voltage detector 52 halts all the pump circuits and reduces the consumption of power by the DRAM. But in the deactivated state, when the internal power voltage Vpp falls equal to or lower than the threshold voltage MV (second voltage), the internal power source voltage detector 52 again drives the pump circuits 12, 22, 32 and 42 among 8 pump circuit to compensate for the voltage drop caused by current leakage.

As is described above, according to this embodiment, in the deactivated state the DRAM drives a small number of pump circuits so as to compensate for a drop of the internal power source voltage Vpp, which is caused by current leakage. Unlike the prior art, a special sub-pump circuit only for compensating for current leakage is not required. Therefore, no space need be allocated for the sub-pump circuit, and a DRAM having high integration can be provided.

In this embodiment, two threshold voltages LV, MV are employed, while the number of pump circuits to be operated is set four at one step, and eight at another step. However, additional threshold voltages may be set with smaller step, and the number of pump circuits be operated may be set one, two or four, for example. As a result, the power consumed by the DRAM can be reduced even more, while concurrently the internal power source voltage Vpp, at which operation of the transistor is ensured, can be maintained.

The bank internal power source voltage detectors 13, 23, 33 and 43 for the banks are voltage comparators for comparing a threshold voltage HV (third voltage)(MV≦HV) with the internal power source voltage Vpp. The bank internal power source voltage detectors, one of which is provided for each of the banks BANK0 to 3, monitor the bank internal power source voltage Vpp in the corresponding bank BANK0–3.

When, at a specific bank, the internal power source Vpp reaches a level equal to or lower than the threshold voltage HV, the relevant bank internal power source voltage detector 13, etc., outputs a detection signal VPH. In response to the detection signal VPH, the bank power source voltage detector 13, etc., activates the internal power generators 12, 15, etc., in the relevant bank to boost the internal power source voltage Vpp in the bank. As a result, for the individual banks BANK0 to 3 a high internal power source voltage Vpp can be maintained and the high-speed operation of the memory in the banks is ensured.

In order to reduce the power consumed by an internal power source voltage detector 13, etc., the detector 13, etc., performs the comparison of voltages only when the corresponding bank is activated. That is, the bank internal power source voltage detector 13, etc., examines the internal power source voltage Vpp at the bank only when a bank activation signal BK0 to BK3 has been received from the bank decoder 51, which decodes row addresses.

An oscillation signal OSM or OSS output by the oscillator 53, and detection signals VPH output by the bank internal power source voltage detectors 13, etc., are transmitted to the respective counters 11, 14, 21, 24, 31, 34, 41 and 44. These counters synthesize the received signals, and output clock signals CLK to drive the pump circuits 12, 15, 22, 25, 32, 35, 42 and 45 respectively.

Upon receiving the clock signal CLK, the pump circuit 12, etc., performs voltage boosting, and generates an internal power source voltage Vpp, which is twice as high as the external power source voltage Vcc, and supplies it to the internal circuit of the row decoder 63. The bank decoder 51 decodes the row address of an address signal Add to generate bank activation signals BK0 to BK3, and transmits them to the bank internal power source voltage detectors 13, etc., respectively. In response to the bank activation signals BK0 to 3, each of the bank internal power source voltage detectors 13, etc., examines the internal power source voltage Vpp at each bank only once. When the internal power source voltage Vpp at a bank has been lowered, the detectors 13, etc., drive the pump circuits in each bank one time.

Figure 3:
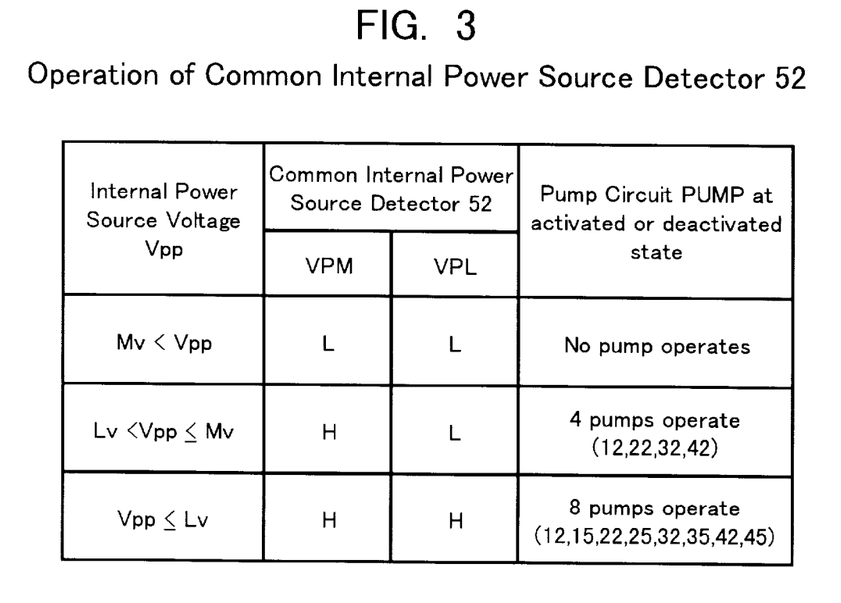
FIG. 3 is a diagram for explaining the operation performed by a common internal power source voltage detector according to the embodiment of the present invention.

FIG. 3 is a diagram for explaining the operation performed by the common internal power source voltage detector 52 and the pump circuits 12 and etc. according to this embodiment. The common internal power source voltage detector 52, which is located substantially in the center of the DRAM, monitors the internal power source voltage Vpp, regardless of whether the banks BANK0 to 3 have been activated or deactivated, and outputs the detection signals VPM and VPL.

As previously described, the common internal power source voltage detector 52 is a voltage comparator employing two threshold voltages LV and MV (LV<MV). And when the common internal power source voltage detector 52 determines that the internal power source voltage Vpp is higher than the threshold voltage MV (second voltage), it outputs both detection signals VPM and VPL at level L. Thus, since the internal power source voltage Vpp in the deactivated state is ensured, none of the pump circuits operate.

But if the internal power source voltage Vpp is equal to or lower than the threshold voltage MV, the detection signal VPM is at level H. And thereafter, the detection signal VPM at level H initiates the operation of the oscillator 53 which transmits, via the counter circuits 11, 21, 31 and 41, an oscillation signal OSM to the pump circuits 12, 22, 32 and 42, so that one of the internal power generators, i.g.12 or 15, in the individual banks are driven. That is, in this case current leakage in the deactivated state is compensated for by the operation of the four pump circuits, 12, 22, 32 and 42.

If the internal power voltage Vpp falls equal to or lower than the threshold voltage LV (first voltage) when the power is on, or at the time an emergency occurs, the detection signal VPL, as well as the detection signal VPM, is at level H. The detection signal VPL at level H changes the switch in the oscillator 53 so that it transmits, via the counter circuits 14, 24, 34 and 44, the another oscillation signal OSS to the remaining pump circuits 15, 25, 35 and 45, and all the internal power generators (pump circuits) in each bank are activated. That is, all 8 pump circuits operate.

Figure 4:
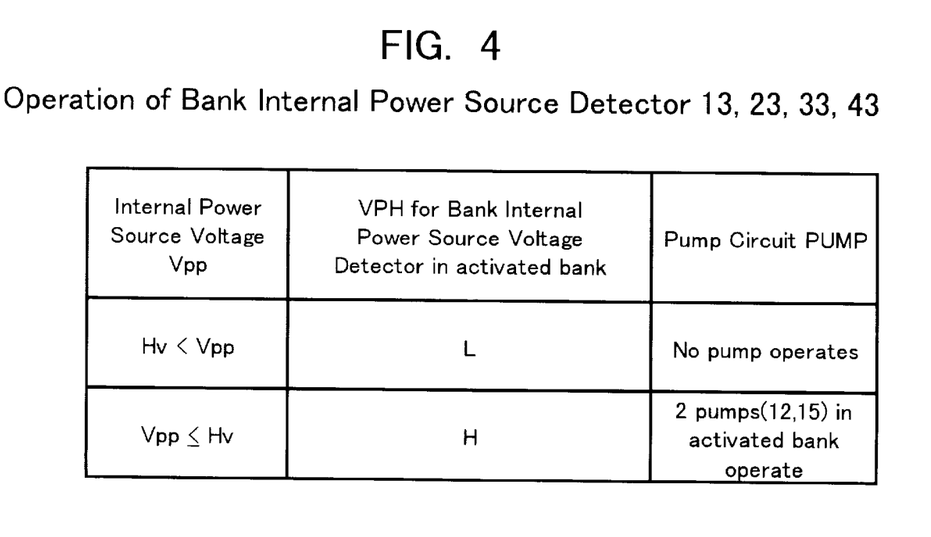
FIG. 4 is a diagram for explaining an operation performed by a bank internal power source voltage detector according to the embodiment of the present invention.

FIG. 4 is a diagram for explaining the operations of the bank internal power source voltage detectors 13 and etc. and the pump circuits 12, 15 and etc. according to this embodiment. The bank internal power source voltage detector 13 and etc. is provided one by one for each bank BANK0 to 3. When each bank BANK0 to 3 is activated, the bank internal power source voltage detector in the activated bank monitors the internal power source voltage Vpp at the bank and output the detection signal VPH.

As previously described, the bank internal power source voltage detector 13 and etc. is a voltage comparator having a threshold voltage HV (third voltage, MV<HV). When the internal power source voltage Vpp at the bank is higher than the threshold voltage HV, the detection signal VPH is at level L, and since the internal power source voltage Vpp at the bank is ensured in the activated state, the pump circuits are not activated.

If the bank internal power source voltage Vpp drops equal to or lower than the threshold voltage HV, the detection signal VPH is at level H. The detection signal VPH is transmitted via the counter circuits 11 and 14 in the same bank (e.g., bank BANK0) to the pump circuits 12 and 15, which are activated in turn. That is, in order to maintain the internal power source voltage Vpp in the activated bank at the level for a normal operation of the memory, the two pump circuits 12, 15 in the bank are activated and a current is supplied with a low impedance for boosting the internal power source voltage Vpp in the bank.

Since the common internal power source voltage detector 52 and the bank internal power source voltage detector 13 and etc. independently operates, when, in the activated state, the internal power source voltage Vpp falls equal to or lower than the threshold voltage MV, the two pump circuits in an activated bank and one pump circuit in inactivated banks may be driven at the same time. Furthermore, in this embodiment, the threshold voltage MV (second voltage) of the common internal power source voltage detector 52 is set lower than the threshold voltage HV (third voltage) of the bank internal power source voltage detector 13 and etc. However, the threshold voltage MV may be set to be equal to the threshold voltage HV. In this case, a sufficiently high internal power source voltage Vpp is ensured, even in the deactivated state, and the reliability of the DRAM can be further increased.

Figure 5:
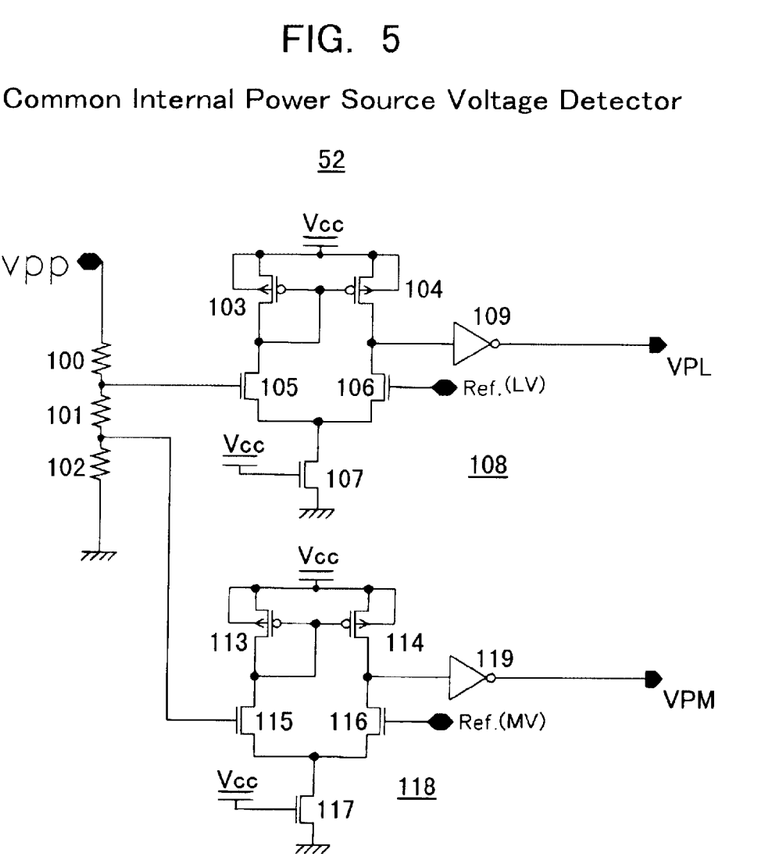
FIG. 5 is a circuit diagram illustrating the voltage detector used to detect the common internal power source voltage according to the embodiment of the present invention.

FIG. 5 is a schematic circuit diagram showing the common internal power source voltage detector 52 according to the embodiment of the present invention. The common internal power source voltage detector 52 comprises a differential amplifier 108, constituted by P channel transistors 103 and 104 and N channel transistors 105, 106 and 107; a differential amplifier 118, constituted by P channel transistors 113 and 114 and N channel transistors 115, 116 and 117; resistors 100, 101 and 102; and inverters 109 and 119.

The internal power source voltage vpp is divided by the resistors 100, 101 and 102, and the divided voltages are supplied to the differential amplifiers 108 and 118. The voltage applied to the gate of the N channel transistor 115 of the differential amplifier 118 is compared with a reference voltage Ref applied to the gate of the N channel transistor 116. Therefore, when the internal power source voltage Vpp falls until it reaches the threshold voltage MV, the drain of the N channel transistor 116 goes to level L, and the signal is inverted by the invertor 119 to set the detection signal VPM level to H.

The voltage applied to the gate of the N channel transistor 105 of the differential amplifier 108 is compared with a reference voltage Ref applied to the gate of the N channel transistor 106. Therefore, when the internal power source voltage Vpp falls further until it reaches the threshold voltage LV, the drain of the N channel transistor 106 goes to level L, and the signal is inverted by the invertor 109 to set the detection signal VPL level to H. In this case, the voltages corresponding to the threshold voltages LV and MV are set at the ratio of the resistance values for the resistors 100, 101 and 102.

Figure 6:
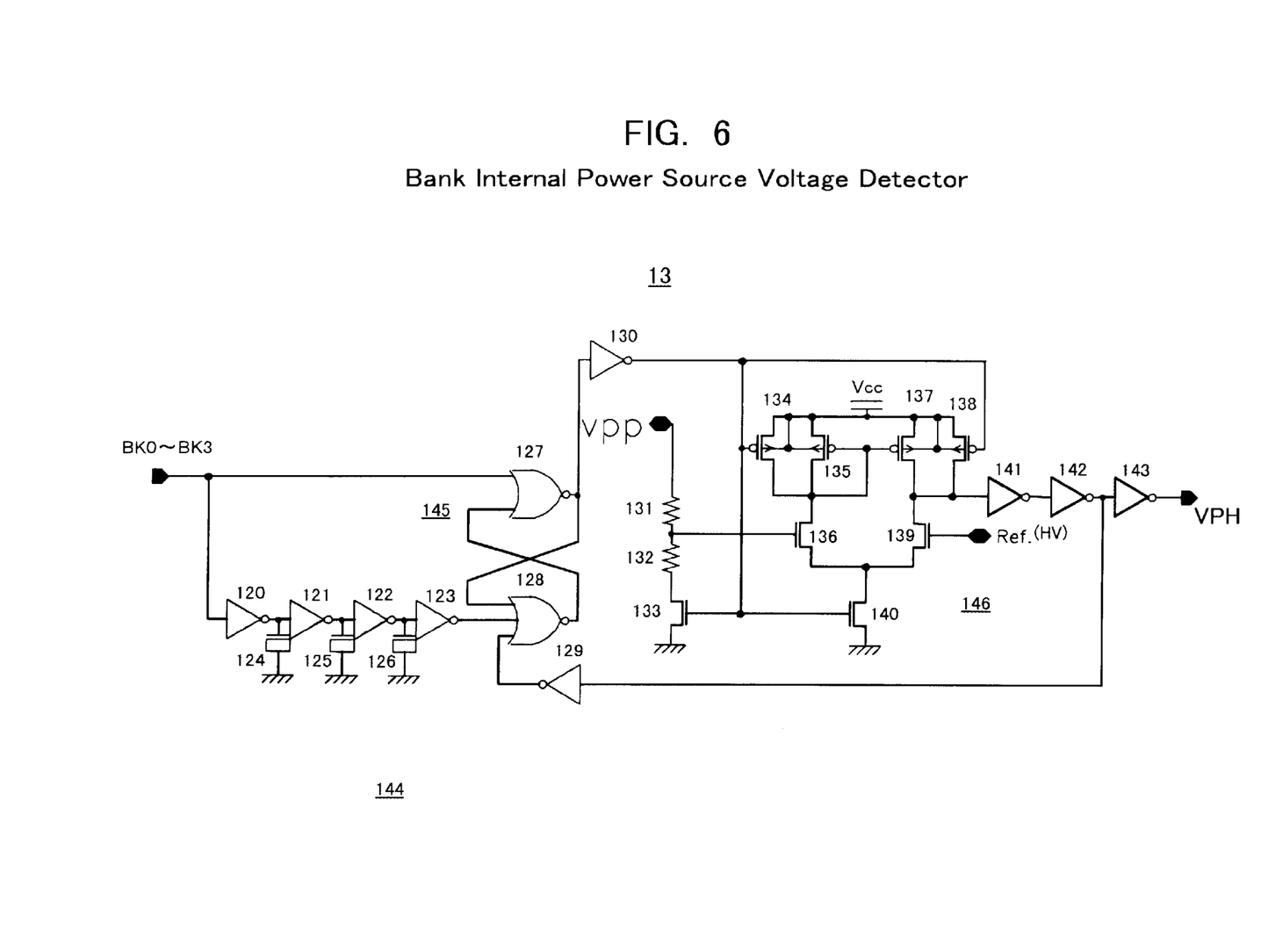
FIG. 6 is a circuit diagram illustrating the voltage detector used to detect the bank internal power source voltage according to the embodiment of the present invention.

FIG. 6 is a schematic circuit diagram illustrating the bank internal power source voltage detector 13 in a bank according to this embodiment. The bank internal power source voltage detector 13 comprises a delay circuit 144, constituted by inverters 120, 121, 122, 123 and capacitors 124, 125 and 126; a latch circuit 145, constituted by NOR circuits 127 and 128; inverters 129, 130, 141, 142 and 143; resistors 131 and 132; an N channel transistor 133; and a differential amplifier 146, constituted by P channel transistors 134, 135, 137 and 138 and N channel transistors 136, 139 and 140.

When bank activation signals BK0 to BK3 are received from the bank decoder 51, the latch circuit 145 is set, and the output of the NOR circuit 127 goes to level L while the output of the invertor 130 goes to level H. The level H signal from the invertor 130 renders the N channel transistors 133 and 140 conductive, and permits the differential amplifier 146 to initiate a comparison of voltages.

The internal power source voltage Vpp is divided by the resistors 131 and 132, and the divided voltages are transmitted to the gate of the N channel transistor 136 in the differential amplifier 146. A reference voltage Ref is transmitted to the gate of the N channel transistor 139 in the differential amplifier 146, and therefore, when the internal power source voltage Vpp in the bank falls equal to or lower than the threshold voltage HV (third voltage), the drain of the N channel transistor 139 goes to level L, and the signal is inverted by the inverters 141, 142 and 143 to set the detection signal VPH to level H. In this case, a voltage corresponding to the threshold voltage HV is set at the ratio of the resistances of the resistors 131 and 132.

The signal output by the invertor 142 is inverted by the invertor 129, the resultant signal is transmitted to the NOR circuit 128, and the latch circuit 145 is reset. Thereafter, the comparison being performed by the differential amplifier 146 is terminated. The bank activation signals BK0 to BK3 are also transmitted to the NOR circuit 128 after the elapse of a predetermined period of time, as specified by the delay circuit 144, and the latch circuit 145 is reset. Therefore, each time row addresses are decoded, the bank internal power source voltage detector 13 in FIG. 6 determines at one time whether the internal power source voltage Vpp in the bank has been reduced. When a drop in the internal power source voltage Vpp is detected during the delay time for the delay circuit 144, a one pulse of the detection signal VPH is output. Thus, the differential amplifier 146 performs a comparison in accordance with the frequency of row side circuit operation, such as driving a word line which causes the internal power source voltage Vpp to fall, and the reduction in the internal power source voltage Vpp at the activated bank is detected at an optimal timing.

Figure 7:
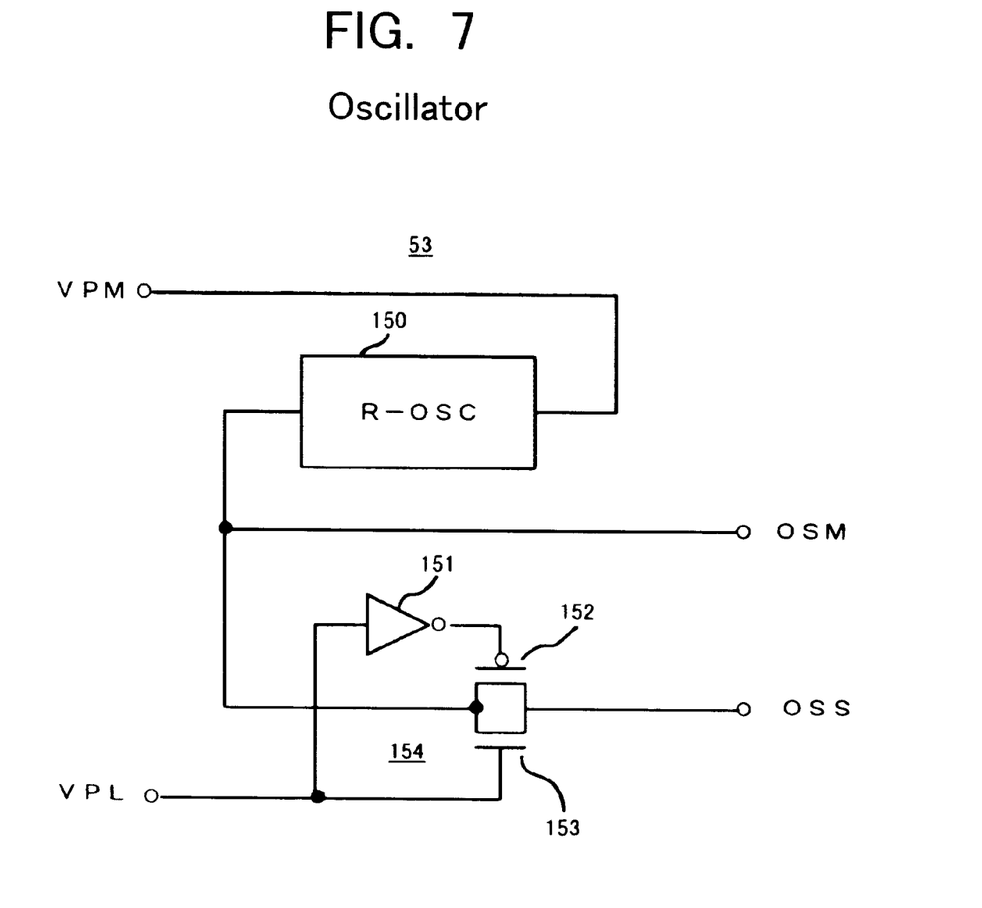
FIG. 7 is a circuit diagram illustrating an oscillator according to the embodiment of the present invention.

FIG. 7 is a schematic circuit diagram showing the oscillator 53 according to the embodiment of the present invention. The oscillator 53 comprises: a ring oscillator 150, a transfer gate 154 constituted by a P channel transistor 152 and an N channel transistor 153, and an invertor 151.

When the internal power source voltage Vpp falls until it reaches the threshold voltage MV, and the detection signal VPM emitted by the common internal power source voltage detector 52 goes to level H, the ring oscillator 150 of the oscillator 53 begins to oscillate, and outputs an oscillation signal OSM to drive the pump circuits 12, 22, 32 and 42 of the individual banks (a total of four pump circuits). At this time, the detection signal VPL is at level L, and the transfer gate 154 is not conductive.

When the internal power source voltage falls until it reaches the threshold voltage LV, and the detection signal VPL from the common internal power source voltage detector 52 goes to level H, the transfer gate 154 is rendered conductive. Thus, the oscillation signal OSS is also output, and the other pump circuits 15, 25, 35 and 45 (a total of four)

of the banks are driven. As a result, all the pump circuits of the banks, i.e., a total of eight pump circuits, are activated.

Figure 8:
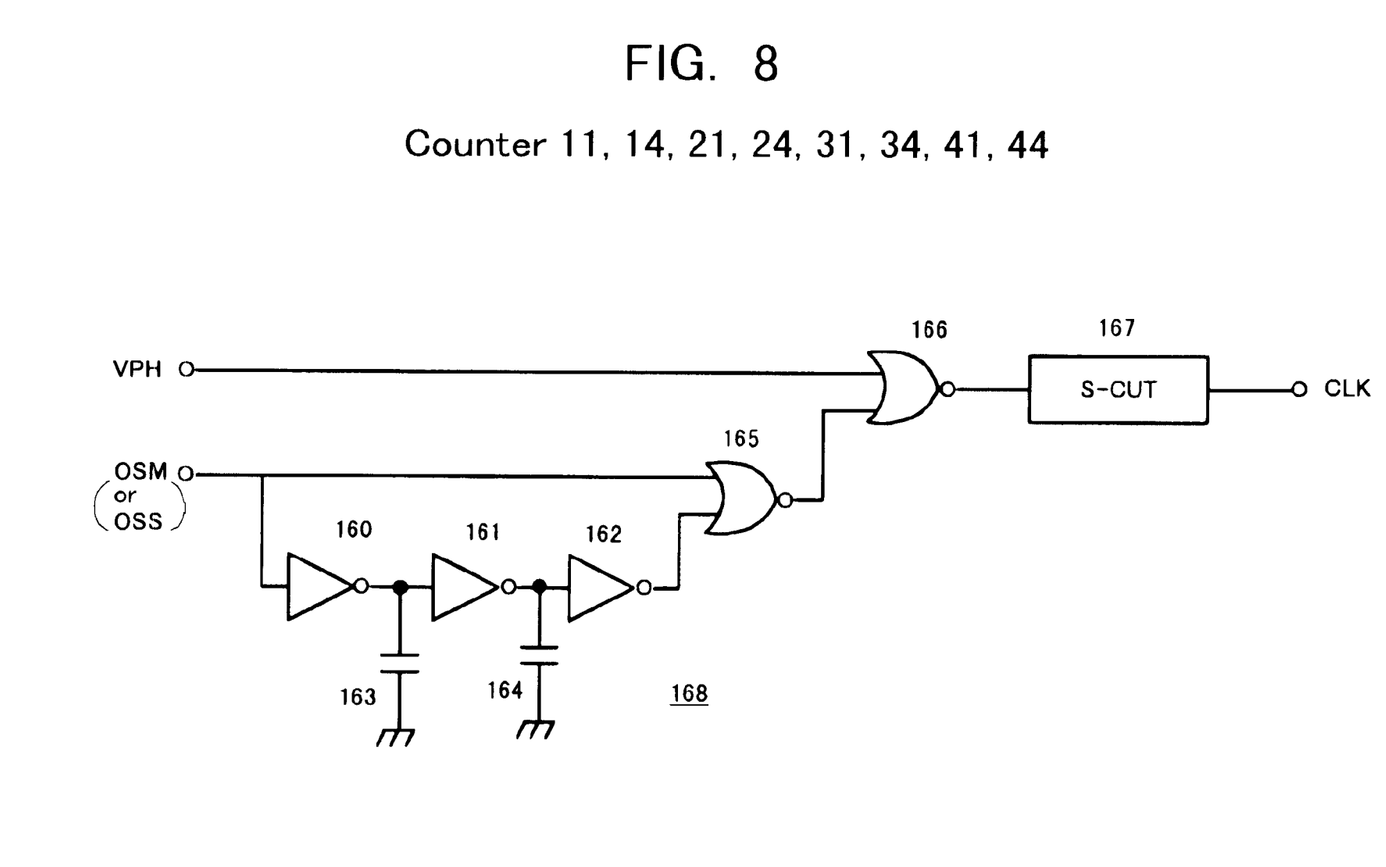
FIG. 8 is a circuit diagram illustrating a counter circuit according to the embodiment of the present invention.

FIG. 8 is a schematic circuit diagram showing the counter circuit 11, 14, 21, 24, 31, 34, 41, 44 according to the embodiment of the present invention. The counter circuit 11 and etc. includes a delay circuit 168, constituted by inverters 160, 161 and 162 and capacitors 163 and 164; NOR circuits 165 and 166; and a counter 167.

The invertor 160 in the delay circuit 168 receives an oscillation signal OSM or OSS from the oscillator 53. Following a predetermined timed delay, the oscillation signal OSM or OSS is inverted by the invertor 162 and the resultant signal is transmitted to the NOR circuit 165, which also receives the oscillation signal OSM or OSS. At the trailing edge of the oscillation signal OSM or OSS, the NOR circuit 165 generates a pulse signal which corresponds to the timed delay for the delay circuit 168, and outputs the pulse signal to the NOR circuit 166.

The NOR circuit 166 synthesizes the signal it receives from the NOR circuit 165 and the detection signal VPH it receives from the bank internal power source voltage detector 13 and etc., and outputs the pulse signal to the counter 167 when the detection signal VPH is level L (Vpp<VH). The counter 167 divides the received signal into a frequency for driving the pump circuit 12, and outputs a clock signal CLK to the pump circuit 12.

Figure 9:
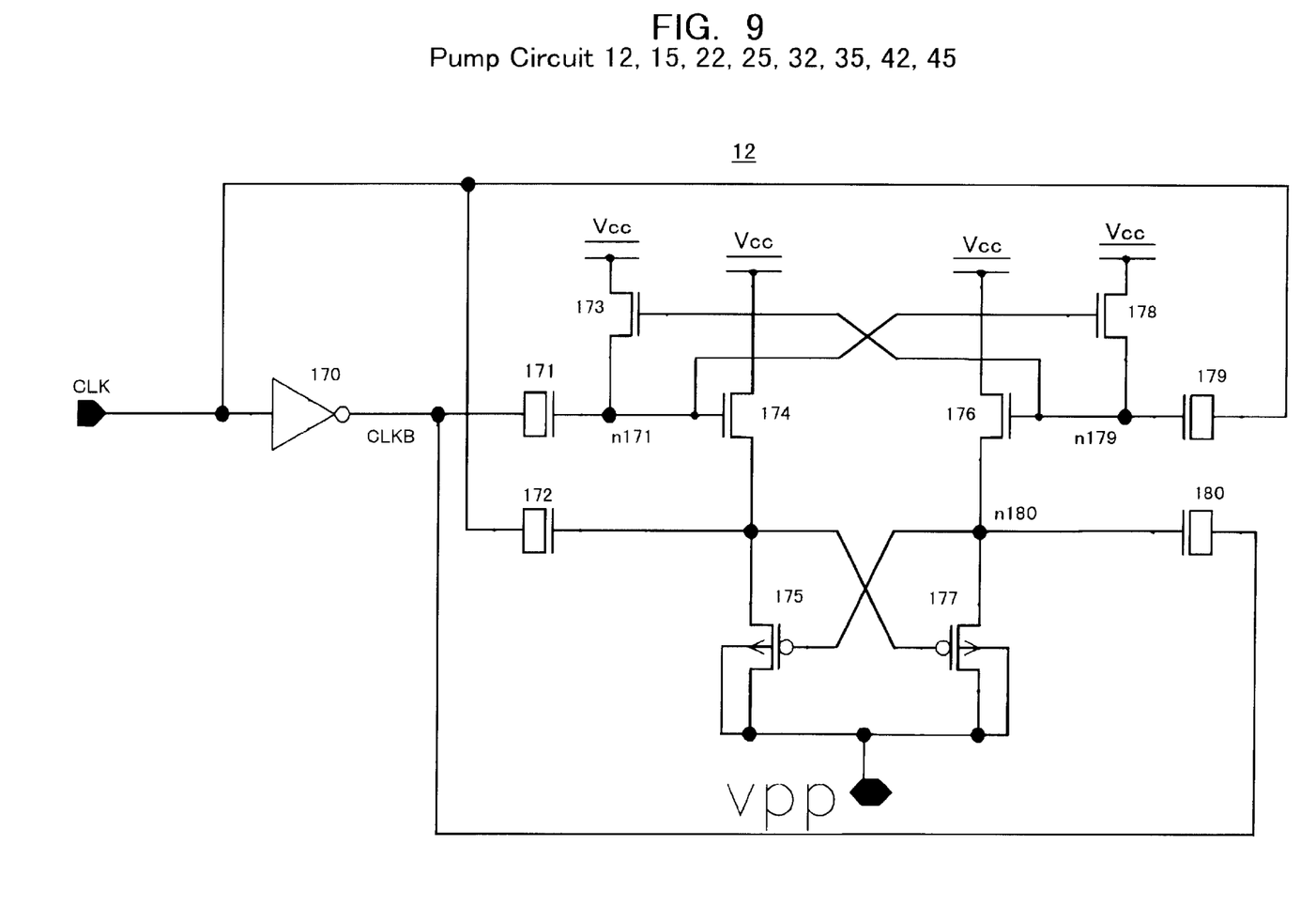
FIG. 9 is a circuit diagram illustrating a pump circuit according to the embodiment of the present invention.

FIG. 9 is a schematic circuit diagram showing the pump circuit 12 according to this embodiment. The pump circuit 12 includes N channel transistors 173, 174, 176 and 178, P channel transistors 175 and 177, capacitors 171, 172, 179 and 180, and an invertor 170.

The external power source voltage Vcc is supplied to the drains of the N channel transistors 173, 174, 176 and 178, and the internal power source voltage Vpp, which is raised substantially twice that of the external power source voltage Vcc, is output at the drains of the P channel transistors 175 and 177.

An explanation will first be given for the operation performed on the right side of the pump circuit 12. A clock signal CLK output by the counter circuit 11 is inverted by the invertor 170 to obtain an inverted clock signal CLKB. Then, when the clock signal CLK falls, the leading edge of the inverted clock CLKB raises the voltage of a node n171 via the capacitor 171. Therefore, the N channel transistor 178 is satisfactorily rendered conductive, a node n179 goes to the level of the external power source voltage Vcc, and the charge on the capacitor 179 is increased until it equals to the external power source voltage Vcc.

Then, the leading edge of the clock signal CLK raises the voltage at the node n179 via the capacitor 179 until it is equal to or higher than (Vcc+vth). Therefore, the N channel transistor 176 is rendered sufficiently conductive, and the voltage of a node n180 is raised substantially to the level of the external power source voltage Vcc.

When the clock signal CLK falls, the leading edge of the inverted clock CLKB raises the voltage at the node n180, via the capacitor 180, which has a large capacity, to about twice that of the external power source voltage Vcc. Then, via the P channel transistor 177, a current flows from the node n180 to the internal power source Vpp, and the level of the internal power source voltage Vpp is raised until it is about twice that of the external power source voltage Vcc. The left side of the pump circuit 12 in FIG. 9 performs a reversed-phase operation of the right side so as to efficiently boost the voltage Vpp.

As is described above, according to the present invention, a memory device can be provided for which the ratio of the area for a pump circuit to the area for a memory cell array is small and high integration is possible.

Also, according to the present invention a memory device can be provided for which a current can be efficiently supplied during a writing or reading operation performed for a cell transistor, and for which low power consumption can be ensured.

What is claimed is:

1. A memory device comprising:

a plurality of banks each of which includes an array of memory cells; and at least a first and a second internal power generator, provided for each of said plurality of banks, for generating an internal power source voltage which differs from a voltage supplied by an external power source, wherein, when a common internal power source voltage in said memory device is lower than a first voltage, said first and second internal power generators in said plurality of banks are activated, wherein, when said common internal power source voltage in said memory device is higher than said first voltage and lower than a second voltage, which is higher than said first voltage, said second internal power generators in said plurality of banks are activated, and wherein, when said internal power source voltage in a bank in the activated state is lower than a third voltage, said first and second internal power generators in the corresponding bank are activated.

2. A memory device according to claim 1, wherein said third voltage is higher than said second voltage.

3. A memory device according to claim 1, wherein said third voltage is substantially equal to said second voltage.

4. A memory device according to claim 1, further comprising:

a common internal power source voltage detector for generating a first activation signal when said common internal power source voltage in said memory device is lower than said first voltage, and for generating a second activation signal when said common internal power source voltage is higher than said first voltage and lower than said second voltage, wherein said first and said second internal power generators in said plurality of banks are activated in response to said first activation signal, and said second internal power generators in said plurality of banks are activated in response to said second activation signal.

5. A memory device according to claim 1 or claim 4, further comprising;

a bank internal power source voltage detector, provided in each bank, for generating a third activation signal when said internal power source voltage in said bank in the activated state is lower than said third voltage, wherein, in response to said third activation signal, said first and said second internal power generators in said bank in the activated state are activated.

6. A memory device according to claim 5, wherein said bank internal power source voltage detector detects a drop of said internal power source voltage in the corresponding bank, every row address decode operation of the activated bank.

7. A memory device according to claim 1, wherein said first and second internal power generators in said banks have substantially the same power generation capabilities.

8. A memory device comprising:
- a plurality of banks each of which includes an array of memory cells; and
- at least a first and a second internal power generator, provided for each of said plurality of banks, for generating an internal power source voltage which differs from a voltage supplied by an external power source,
- wherein, when a common internal power source voltage in said memory device is lower than a first voltage, said first and second internal power generators in said plurality of banks are activated, and
- wherein, when said common internal power source voltage in said memory device is higher than said first voltage and lower than a second voltage, which is higher than said first voltage, said second internal power generators in said plurality of banks are activated.

9. A memory device according to claim 8, further comprising:
- a common internal power source voltage detector for generating a first activation signal when said common internal power source voltage in said memory device is lower than said first voltage, and for generating a second activation signal when said common internal power source voltage is higher than said first voltage and lower than said second voltage,
- wherein said first and said second internal power generators in said plurality of banks are activated in response to said first activation signal, and said second internal power generators in said plurality of banks are activated in response to said second activation signal, said common internal power source voltage detector operates regardless at activated state or inactivated state in said memory device.

* * * * *